(12) United States Patent
Helgenberg et al.

(10) Patent No.: US 6,972,949 B1  
(45) Date of Patent: Dec. 6, 2005

(54) CABLE ROUTING SYSTEM

(75) Inventors: John A. Helgenberg, Paoli, PA (US); Kenneth J. Neeld, West Chester, PA (US); Terry W. Louth, Narvon, PA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 10/727,758

(22) Filed: Dec. 3, 2003

(51) Int. Cl.[7] .................................. G06F 1/16
(52) U.S. Cl. ........................ 361/683; 361/679
(58) Field of Search ................. 361/679, 683

(56) References Cited

U.S. PATENT DOCUMENTS 6,070,742 A * 6/2000 McAnally et al. ............ 211/26
6,305,556 B1 * 10/2001 Mayer ............................ 211/26
6,392,149 B1 * 5/2002 Kim et al. ................. 174/72 A

* cited by examiner

Primary Examiner—Yean-Hsi Chang
(74) Attorney, Agent, or Firm—Lisa A. Rode; Mark T. Starr; RatnerPrestia

(57) ABSTRACT

A cable routing system facilitating interconnection between a computer system and a chassis that may be extended and retracted with respect to the computer system along at least one support member is provided. The system includes a folding arm assembly supported by the at least one support member such that the folding arm assembly is moveable between a retracted position when the chassis is retracted with respect to the computer system and an extended position when the chassis is extended with respect to the computer system. The folding arm assembly defines at least one channel for routing a cable between the chassis and the computer system. The system also includes a strain relief supported by the at least one support member and positioned between the folding arm assembly and a termination point of the cable such that the strain relief substantially stabilizes the cable at the termination point.

18 Claims, 11 Drawing Sheets

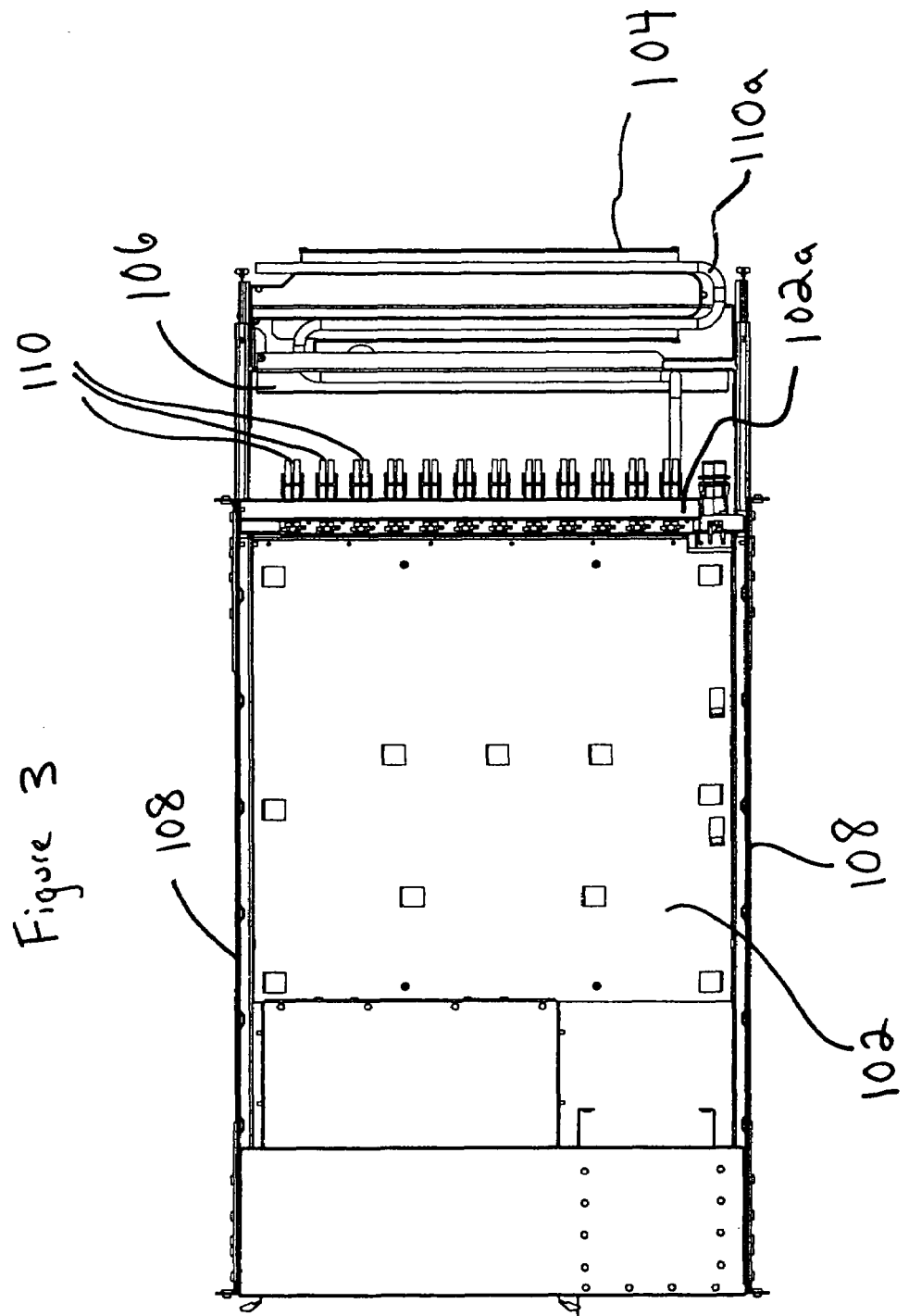

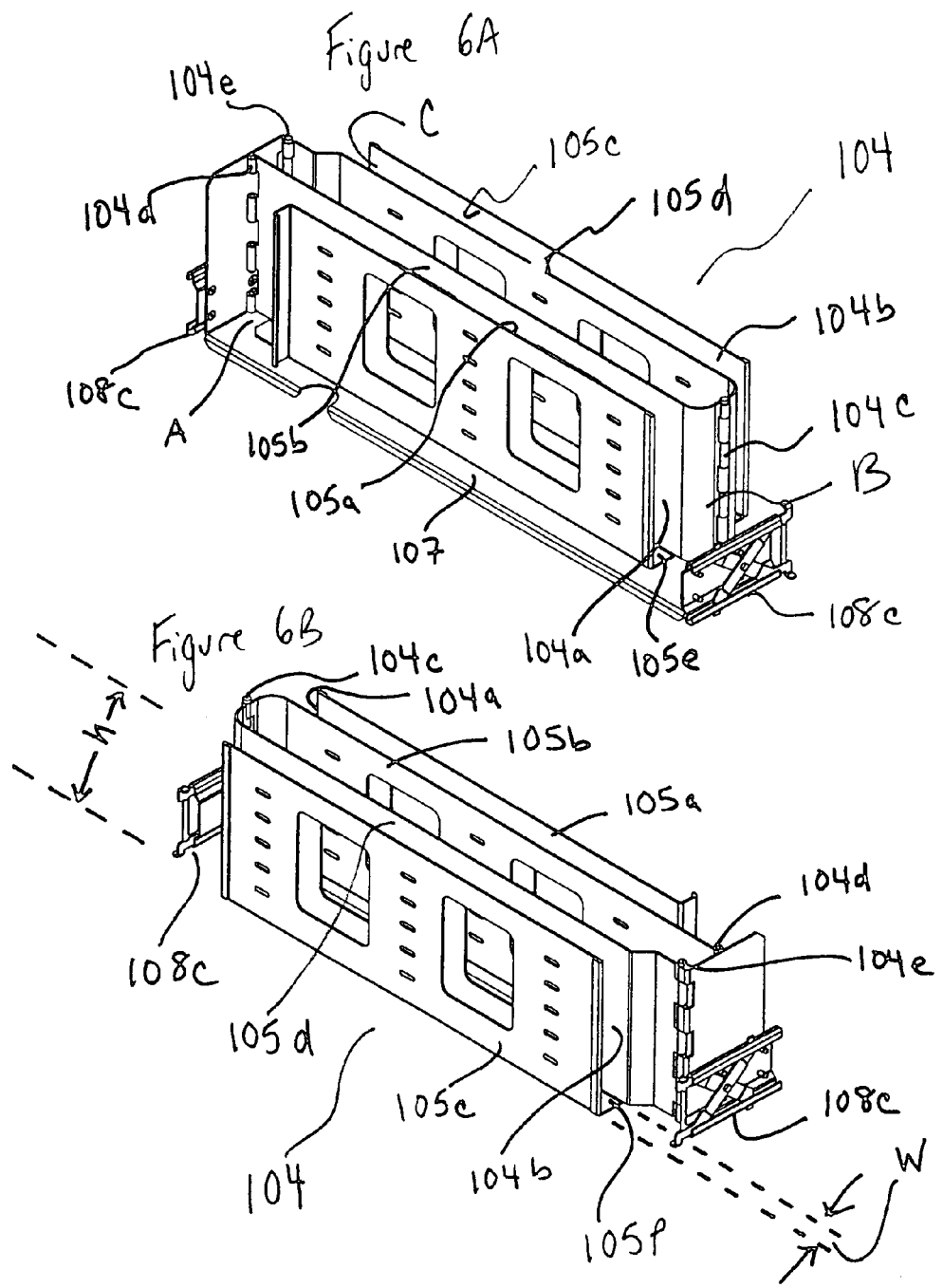

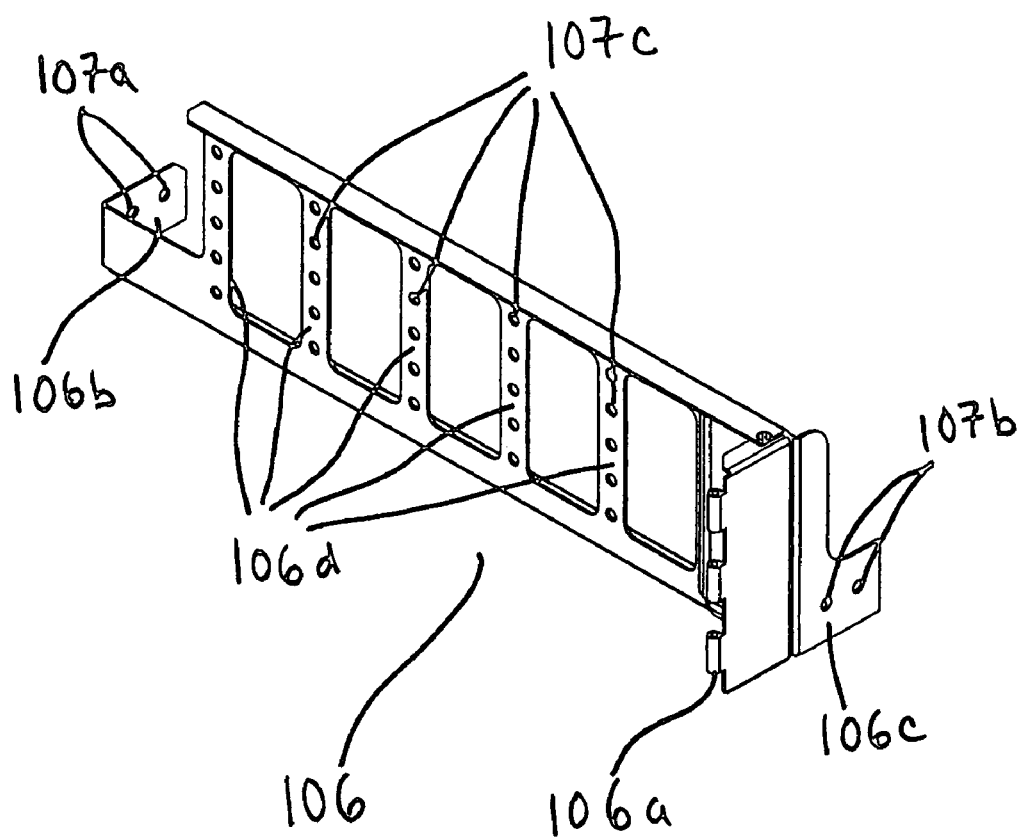

CABLE ROUTING SYSTEM

FIELD OF THE INVENTION

This invention relates to a cable routing system for use in a computer system, and more particularly, to a cable routing system for use in a computer system including a chassis that may be extended and retracted with respect to the remainder of the computer system.

BACKGROUND OF THE INVENTION

Computer systems such as computer server systems often include components that are desirably accessible during operation or shutdown of the computer system. For example, a computer system may include a chassis holding computer cards, where the chassis may be withdrawn from the remainder of the computer system so that the computer cards are accessible. Accessibility of the computer cards may be desirable for a number of reasons such as replacement, repair, upgrade, etc.

Cables provide interconnection between components held in the chassis (e.g., the computer cards) and the remainder of the computer system. Because the chassis may be withdrawn from the computer system these cables desirably have sufficient length to compensate for this withdrawal of the chassis while maintaining the interconnections; however, such lengthy cables occupy a substantial amount of volume in the computer system. Further, the cables are difficult to keep in a desirable position during the withdrawal of the chassis. Further still, during the withdrawal of the chassis tension applied to the cables may translate to termination points of the cables, thereby resulting in potential damage to the termination points or to the cables themselves. Additionally, such damage may result in electromagnetic interference within the computer system, and particularly to components included within the chassis.

Accordingly, it would be desirable to provide a more effective mechanism for routing cables in a computer system to overcome one or more of the above-recited deficiencies.

SUMMARY OF THE INVENTION

According to an exemplary embodiment of the present invention, a cable routing system is provided for facilitating interconnection between a computer system and a chassis that may be extended and retracted with respect to the computer system along at least one support member. The cable routing system includes a folding arm assembly supported by the at least one support member such that the folding arm assembly is moveable between a retracted position when the chassis is retracted with respect to the computer system and an extended position when the chassis is extended with respect to the computer system. The folding arm assembly defines at least one channel for routing a cable between the chassis and the computer system. The cable routing system also includes a strain relief supported by the at least one support member and positioned between the folding arm assembly and a termination point of the cable such that the strain relief substantially stabilizes the cable at the termination point.

According to another exemplary embodiment of the present invention, a computer system is provided. The computer system includes a frame and a chassis that may be extended and retracted with respect to the frame. The computer system also includes a support member along which the chassis is extended and retracted with respect to the frame. The computer system also includes a folding arm assembly at least partially supported by the support member such that the folding arm assembly is moveable between a retracted position when the chassis is retracted with respect to the frame and an extended position when the chassis is extended with respect to the frame. The folding arm assembly defines at least one channel for routing a cable between the chassis and the frame. The computer system also includes a strain relief at least partially supported by the support member and positioned between the folding arm assembly and a termination point of the cable such that the strain relief substantially stabilizes the cable at the termination point.

According to another exemplary embodiment of the present invention, an arm assembly for holding a cable interconnecting a computer system and a chassis that may be extended and retracted with respect to the computer system is provided. The arm assembly includes a plurality of arm portions. Each of the arm portions includes a side surface and a base surface together at least partially defining a channel configured to receive a cable. The arm portions are hingedly connected to one another thereby facilitating extension and retraction of the arm assembly when the chassis is extended and retracted with respect to the computer system. A ratio of a height of the side surface to a width of the base surface is at least about 4 to 1.

According to another exemplary embodiment of the present invention, a support assembly for supporting a chassis that may be extended and retracted with respect to a frame is provided. The support assembly includes a rail system including a chassis portion and a frame portion. The chassis portion is coupled to the chassis and slidingly engaged with the frame portion such that the chassis portion is moveable with respect to the frame portion between a retracted position when the chassis is retracted with respect to the frame and an extended position when said chassis is extended with respect to the frame. The frame portion is configured to be coupled to the frame. The support assembly also includes a plurality of arm portions hingedly connected to one another and extending between the chassis portion of the rail system and the frame portion of the rail system such that the arm portions are retracted with respect to one another when the chassis is retracted with respect to the frame, and the arm portions are extended with respect to one another when the chassis is extended with respect to the frame. Each of the arm portions defines a channel configured to receive a cable.

According to another exemplary embodiment of the present invention, a method of routing a cable between a computer system and a chassis that may be extended and retracted with respect to the computer system along at least one support member is provided. The method includes positioning the cable at least partially in a channel defined by a folding arm assembly disposed between the computer system and the chassis and supported by the at least one support member. The method also includes coupling the cable to a strain relief positioned between the folding arm assembly and a termination point of the cable such that the strain relief substantially stabilizes the cable at the termination point.

BRIEF DESCRIPTION OF THE DRAWINGS

Exemplary embodiments of the invention will be described with reference to the drawings, of which:

FIG. 3 is a top view of the chassis and cable routing system of FIG. 1 in a retracted position;

FIG. 6A is a front perspective view of a portion of the cable routing system of FIG. 1;

FIG. 6B is a rear perspective view of a portion of the cable routing system of FIG. 1;

FIG. 7 is a perspective view of another portion of the cable routing system of FIG. 1;

DETAILED DESCRIPTION OF THE INVENTION

Figure 1:
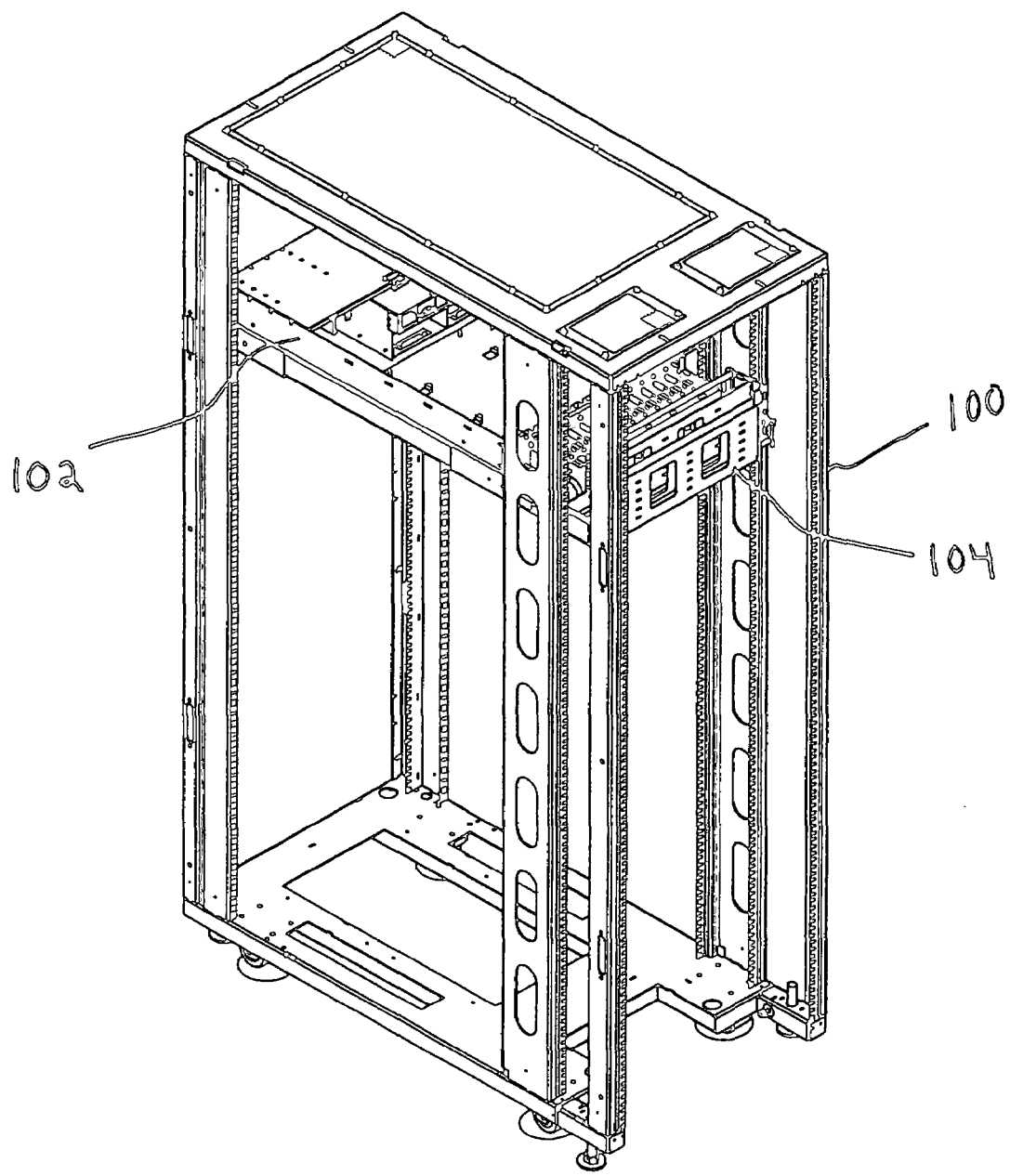
FIG. 1 is a rear perspective view of a portion of a computer system including a chassis and a cable routing system in accordance with an exemplary embodiment of the present invention.

Preferred features of embodiments of this invention will now be described with reference to the figures. It will be appreciated that the spirit and scope of the invention is not limited to the embodiments selected for illustration. Also, it should be noted that the drawings are not rendered to any particular scale or proportion. It is contemplated that any of the configurations and materials described hereafter can be modified within the scope of this invention.

As used herein, the term computer system refers to a broad class of systems including computer components. For example, the computer system may be a computer server system including one or more computer servers mounted in a common cabinet or frame. Alternatively, the term computer system may refer to a frame used to support a chassis configured for extension and retraction with respect to the frame or to any system used in connection with a computer. The term chassis refers to any computer system component that may be extended and retracted with respect to the remainder of the computer system. For example, the chassis may be a chassis mounted computer server included in a computer server system. Alternatively, the chassis may include any of a number of computer system components (e.g., cards, circuit boards, memory devices, etc.) to which access (e.g., through the extension and retraction of the chassis) is desired.

This invention addresses problems related to routing cables within a cabinet of a computer system such as a computer server system, and more particularly, to routing cables between a chassis or portion of the computer system and the remainder of the computer system, where the chassis may be extended and retracted or otherwise moved with respect to the remainder of the computer system.

Referring to the Figures generally, a cable routing system facilitating interconnection between a computer system (not shown) and chassis 102 that may be extended and retracted with respect to the computer system along at least one support member 108 is provided. The cable routing system includes folding arm assembly 104 supported by support member 108 such that folding arm assembly 104 is moveable between a retracted position when chassis 102 is retracted with respect to the computer system and an extended position when chassis 102 is extended with respect to the computer system. Folding arm assembly 104 defines at least one channel 104*a*, 104*b* for routing a cable 110*a* between chassis 102 and the computer system. The cable routing system also includes strain relief 106 supported by the at least one support member 108 and positioned between folding arm assembly 104 and termination point 110 of the cable 110*a* such that strain relief 106 substantially stabilizes the cable 110*a* at termination point 110.

According to another exemplary embodiment, the computer system includes frame 100 and chassis 102 that may be extended and retracted with respect to frame 100. The computer system also includes support member 108 along which chassis 102 is extended and retracted with respect to frame 100. The computer system also includes folding arm assembly 104 at least partially supported by support member 108 such that folding arm assembly 104 is moveable between a retracted position when chassis 102 is retracted with respect to frame 100 and an extended position when chassis 102 is extended with respect to frame 100. Folding arm assembly 104 defines at least one channel 104*a*, 104*b* for routing a cable 110*a* between chassis 102 and frame 100. The computer system also includes strain relief 106 at least partially supported by support member 108 and positioned between folding arm assembly 104 and termination point 110 of the cable 110*a* such that strain relief 106 substantially stabilizes the cable at termination point 110.

According to another exemplary embodiment, arm assembly 104 includes a plurality of arm portions 109*a* and 109*b*. Each of arm portions 109*a* and 109*b* includes at least one side surface (e.g., 105*a*, 105*b*, 105*c*, 105*d*) and a base surface (e.g., 105*e*, 105*f*) together at least partially defining a channel (e.g., 104*a*, 104*b*) configured to receive a cable 110*a*. Arm portions 109*a* and 109*b* are hingedly connected to one another thereby facilitating extension and retraction of arm assembly 104 when chassis 102 is extended and retracted with respect to the computer system. A ratio of a height of side surface (e.g., 105*a*, 105*b*, 105*c*, 105*d*) to a width of base surface (e.g., 105*e*, 105*f*) is at least about 4 to 1.

According to another exemplary embodiment of the present invention, a support assembly includes rail system 108 including chassis portion 108*a* and frame portion 108*b*. Chassis portion 108*a* is coupled to chassis 102 and slidingly engaged with frame portion 108*b* such that chassis portion 108*a* is moveable with respect to frame portion 108*b* between a retracted position when chassis 102 is retracted with respect to frame 100 and an extended position when chassis 102 is extended with respect to frame 100. Frame portion 108*b* is configured to be coupled to frame 100. The support assembly also includes a plurality of arm portions 109*a* and 109*b* hingedly connected to one another and extending between chassis portion 108*a* of rail system 108 and frame portion 108*b* of rail system 108 such that arm portions 109*a* and 109*b* are retracted with respect to one another when chassis 102 is retracted with respect to frame 100, and arm portions 109*a* and 109*b* are extended with respect to one another when chassis 102 is extended with respect to frame 100. Each of arm portions 109*a* and 109*b* defines channel 104*a* and 104*b* configured to receive a cable 110*a*.

According to another exemplary embodiment of the present invention, a method of routing a cable between a computer system and chassis 102 that may be extended and retracted with respect to the computer system along at least one support member 108 is provided. The method includes positioning the cable 110*a* at least partially in channel 104*a*, 104*b* defined by folding arm assembly 104 disposed between the computer system and chassis 102 and supported by at least one support member 108. The method also includes coupling the cable 110*a* to strain relief 106 positioned between folding arm assembly 104 and termination point 110 of the cable 110*a* such that strain relief 106 substantially stabilizes the cable 110*a* at termination point 110.

FIG. 1 is a perspective view of a portion of a computer system such as a computer server system. The computer system includes frame 100 and chassis 102. Frame 100 can be a standard rack such as a 19" rack commonly used in this industry. Chassis 102 may be a computer server within the computer system, for example. For simplicity, additional components of the computer system have been omitted from FIG. 1.

In order to access chassis 102 (or a component included in chassis 102), chassis 102 may be extended and retracted with respect to frame 100. Cables that connect chassis 102 to the remainder of the computer system or to a location external to the computer system (not shown in FIG. 1) may be routed between chassis 102 and their destination at least partially using folding arm assembly 104, as explained herein.

Figure 2:
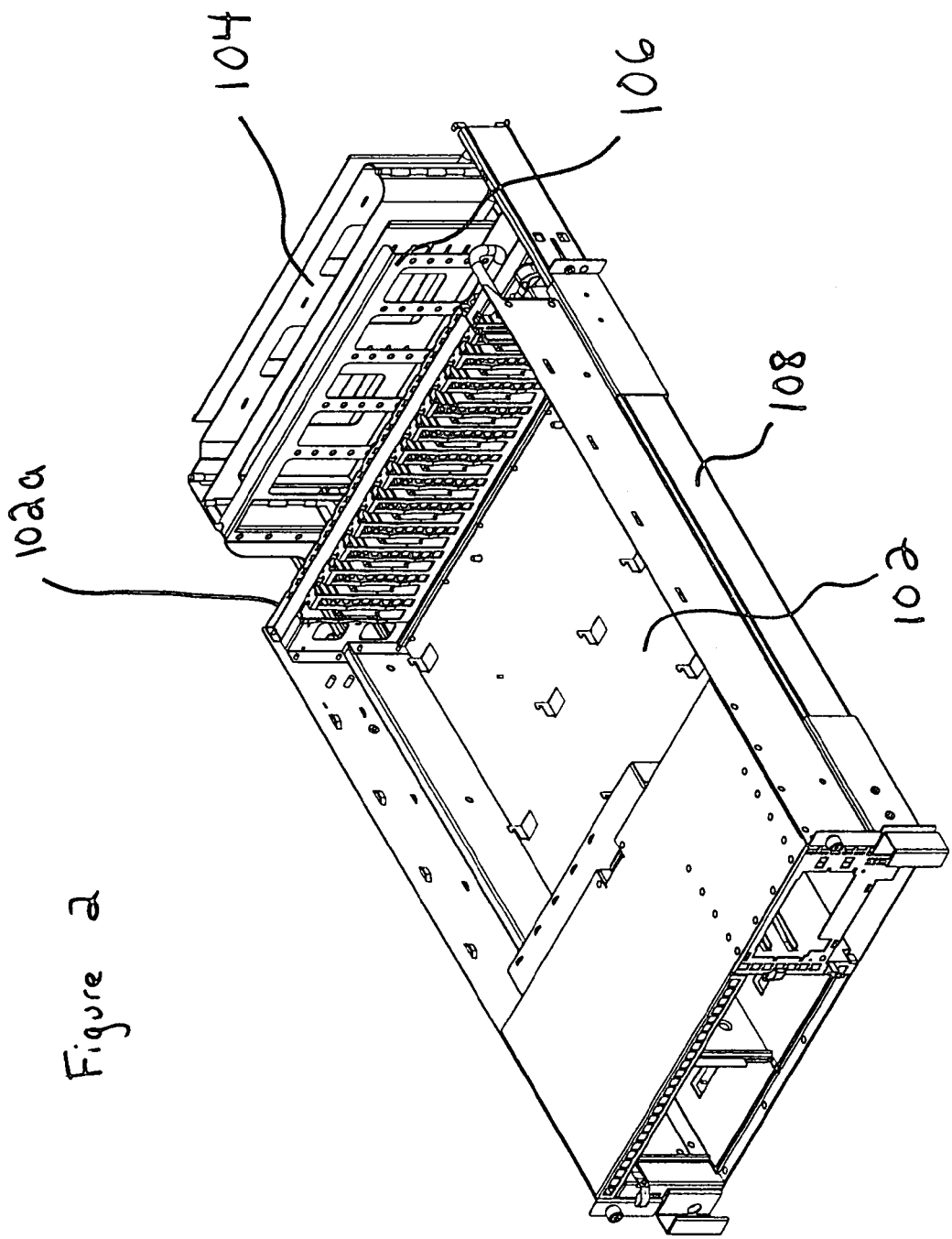
FIG. 2 is a front perspective view of the chassis and cable routing system of FIG. 1 in a retracted position.

FIG. 2 is a front perspective view of chassis 102, with various components of chassis 102 removed for simplicity. Support member 108 (hereinafter rail system 108) is coupled to chassis 102 and facilitates extension and retraction of chassis 102 with respect to frame 100 or the associated computer system. Cables (not shown in FIG. 2) extend from chassis rear 102*a* toward their termination destination (e.g., another portion of the computer system, a location remote to the computer system, etc.). These cables extend through strain relief 106 and folding arm assembly 104 towards their destination. As described herein, the cables may be coupled to strain relief 106 (e.g., using tie wraps or the like), and then routed through one or more channels defined by folding arm assembly 104.

FIG. 3 is a top view of chassis 102, again with certain elements removed for simplicity. Two rail systems 108 are also shown in FIG. 3 for facilitating extension and retraction of chassis 102 with respect to frame 100 (not shown in FIG. 3). A number of termination points 110 extend from chassis rear 102*a* towards strain relief 106 and folding arm assembly 104. Cables terminated at or coupled to one of termination points 110 are routed through strain relief 106 (to which the cables are coupled) and then through one or more channels defined by folding arm assembly 104. The cables extend from folding arm assembly 104 to another point in the computer system (not shown in FIG. 3) or to a location remote from the computer system.

Figure 4A:
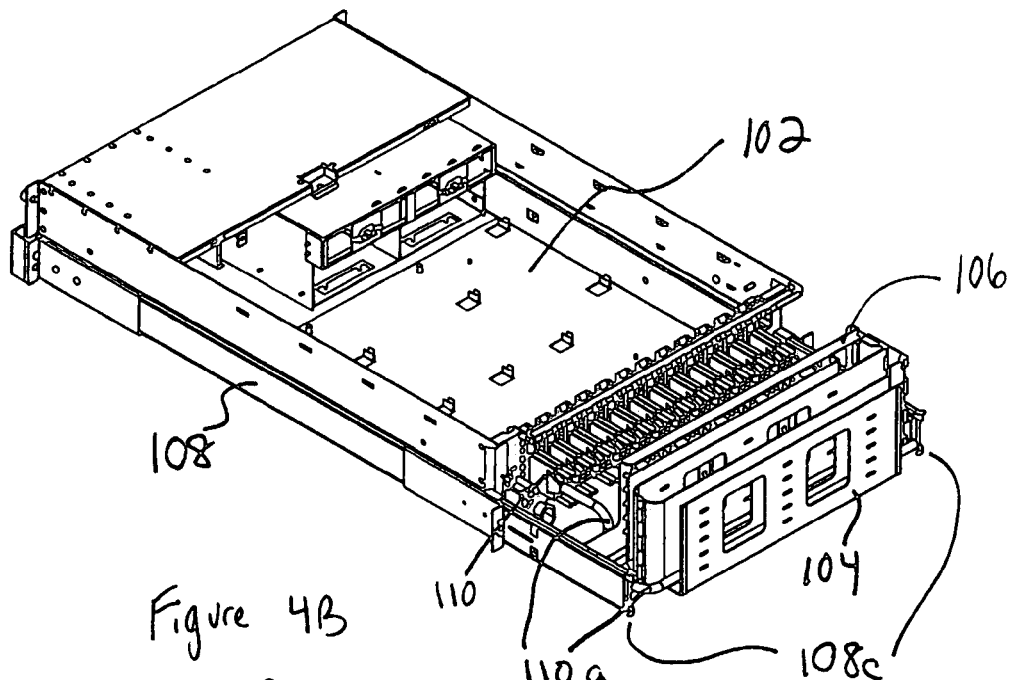
FIG. 4A is a rear perspective view of the chassis and cable routing system of FIG. 1 in a retracted position.

FIG. 4A is a rear perspective view of chassis 102 and rail system 108 along which chassis 102 extends and retracts with respect to frame 100. Cable 110*a* is shown terminated to termination point 110. Cable 110*a* extends through strain relief 106 and one or more channels defined by folding arm assembly 104. Rail clip portion 108*c* of rail system 108 provides interconnection between horizontal strut 107 (shown more clearly in FIG. 6A and FIG. 8) and the remainder of rail system 108, as will be explained more clearly with respect to FIG. 6A and FIG. 8.

Figure 4B:
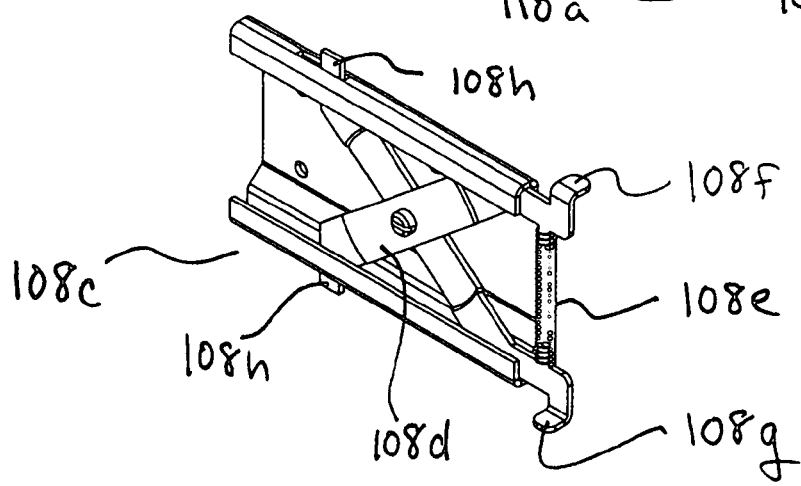
FIG. 4B is a detailed perspective view of a portion of the system of FIG. 4A.

FIG. 4B is a perspective view of rail clip portion 108*c* of rail system 108. Rail clip portion 108*c* includes scissor clip 108*d*, spring portion 108*e*, tabbed portions 108*f*–108*g*, and scissor actuated latching tabs 108*h*.

Figure 5A:
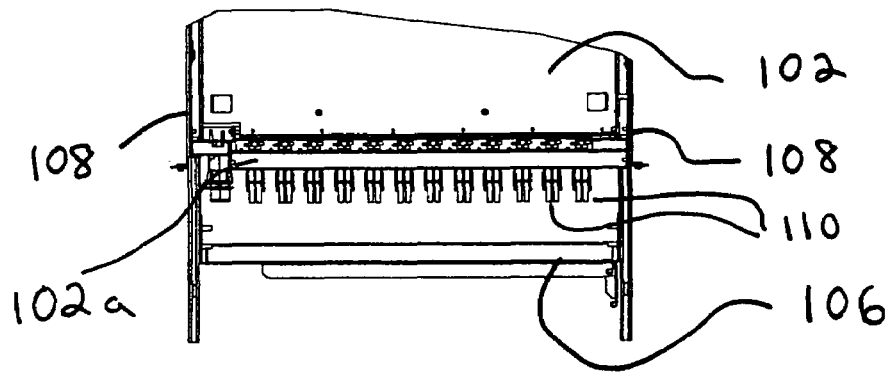
FIG. 5A is a top view of a portion of the chassis and a portion of the cable routing system of FIG. 1 in a retracted position.
Figure 5B:
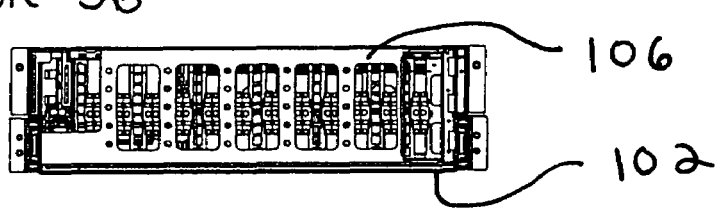
FIG. 5B is a rear view of the chassis and a portion of the cable routing system of FIG. 1.
Figure 5C:
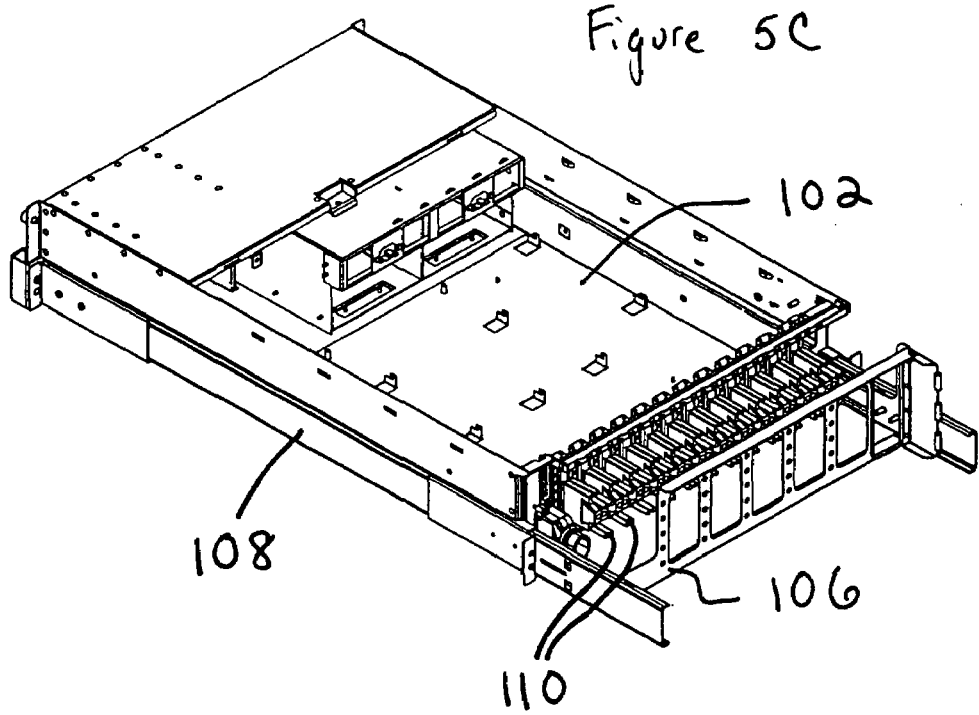
FIG. 5C is a rear perspective view of the chassis and a portion of the cable routing system of FIG. 1 in a retracted position.

FIG. 5A is a partial top view of chassis 102 and rail system 108. Termination points 110 extend from chassis rear 102*a* toward strain relief 106. FIG. 5B is a rear view of chassis 102 and strain relief 106. FIG. 5C is a rear perspective view of chassis 102, rail system 108, termination points 110, and strain relief 106.

FIG. 6A is a front perspective view of folding arm assembly 104. Rail clip portion 108*c* is coupled to horizontal strut 107, and engages with the remainder of rail system 108 such that folding arm assembly 104 is supported by horizontal strut 107 when folding arm assembly 104 is in the retracted position illustrated in FIG. 6A.

More specifically, rail clip portion 108*c* includes spring loaded scissor clip 108*d* (as shown in FIG. 4B) such that it may be snapped into a cavity of an end portion of rail system 108, preferably without the use of additional tools. Tabbed portions 108*f* and 108*g* are provided to manually squeeze rail clip portion 108*c* in a state of compression such that it may be positioned within the aforementioned cavity, and then tabbed portions 108*f* and 108*g* can be released. In facilitating this snapping action, rail clip portion 108*c* includes scissor actuated latching tabs 108*h* (also shown in FIG. 4B) that engage with slots defined in outer portion 108*b* of rail system 108 (illustrated in FIG. 8).

Referring again to FIG. 6A, folding arm assembly 104 includes side surfaces 105*a*, 105*b*, 105*c*, and 105*d* (hereinafter wall portions 105*a*, 105*b*, 105*c*, and 105*d*), as well as base surfaces 105*e* and 105*f* (hereinafter base portions 105*e* and 105*f*). Wall portions 105*a* and 105*b*, along with base portion 105*e*, are configured to define a channel 104*a* for receiving a cable. Likewise, wall portions 105*c* and 105*d*, along with base portion 105*f* (See FIG. 6B), are configured to define channel 104*b* for receiving a cable. Folding arm assembly 104 also includes hinged portions 104*c*, 104*d*, and 104*e* for facilitating pivotal movement of folding arm assembly during extension and retraction of chassis 102 with respect to frame 100. Hinged portion 104*c* hingedly couples wall portion 105*b* to wall portion 105*d*. As such, hinged portion 104*c* provides pivotal interconnection between channel 104*a* and channel 104*b*. Hinged portion 104*d* is configured to be hingedly coupled to hinged portion 106*a* of strain relief 106 (illustrated in FIG. 7).

According to an exemplary embodiment of the present invention, folding arm assembly may be viewed as comprising a number of arm portions (e.g., arm portions 109*a* and 109*b* illustrated in FIG. 8) joined by hinged portions such as hinged portion 104*c*. For example, two such arm portions may be included. Wall portions 105*a* and 105*b*, as well as base portion 105*e*, are included in one arm portion. Further, wall portions 105*c* and 105*d*, as well as base portion 105*f* (See FIG. 6B), are included in another arm portion. Each of these arm portions (including base and wall portions) defines a channel (e.g., channels 104*a* and 104*b*) for holding cables. In such an embodiment, cables are routed from termination points 110 through strain relief 106. As described above, the cables may be secured to strain relief 106. From strain relief 106 the cables enter opening "A" of folding arm assembly 104 illustrated in FIG. 6A. From opening "A" the cables are routed through channel 104a and around hinged portion 104c at opening "B" of folding arm assembly 104 illustrated in FIG. 6A. The cables continue through channel 104b, and then onward to opening "C" of folding arm assembly 104 illustrated in FIG. 6A. From opening "C" the cables are then routed to their destination within the computer system or to a location remote from the computer system.

FIG. 6B is a rear perspective view of folding arm assembly 104 including wall portions 105a, 105b, 105c, and 105d, base portions 105e (See FIG. 6A) and 105f, as well as rail clip portion 108c of rail system 108. Additionally, channels 104a and 104b defined by wall portions 105a, 105b, 105c, and 105d, and base portions 105e (See FIG. 6A) and 105f, are also shown. As illustrated in FIG. 6B, channel 104b (and/or channel 104a) has a width "W". Additionally, channel 104b (and/or channel 104a) has a height "H" defined by one or more of wall portions 105c and 105d (or wall portions 105a and 105b for channel 104a).

It has been found by the inventors that certain ratios of height "H" of channel 104b to width "W" of channel 104b are particularly desirable. For example, an exemplary ratio may be at least about 4 to 1 (i.e., the height of channel 104b is at least about four times greater than the width of channel 104b). One exemplary ratio is 5.33 to 1 (e.g., a height of four inches and a width of three-quarters of an inch). According to another exemplary embodiment of the present invention the width is determined by adjusting the height "H" of channel 104b to be substantially equivalent to a height of chassis 102 and by applying one of the foregoing ratios.

Such ratios of the channel height to the channel width are particularly desirable for a number of reasons. For example, a substantially rigid channel 104b is provided that substantially maintains its shape and vertical position during extension and retraction of chassis 102 with respect to frame 100. Also, it has been discovered that, by maximizing the height "H" of the channel to correspond to the height of the chassis, the width of the channel can be decreased while holding the same number of cables. Such an increase in height "H" and a reduction in width "W" increases the H:W ratio. It has further been discovered that an increased H:W ratio provides a stronger, sturdier cable support.

Of course, the exemplary H:W ratios specified herein are not applicable to each embodiment of the present invention. For example, in certain applications the volume and weight of the interconnecting cables in the computer system are such that a different H:W ratio (e.g., a smaller ratio) of the channel may be utilized.

FIG. 7 is a perspective view of strain relief 106. As described above, strain relief 106 includes hinged portion 106a configured to be hingedly coupled to hinged portion 104d (illustrates in FIG. 6A and FIG. 8) of folding arm assembly 104. Strain relief 106 also includes side portions 106b and 106c which define holes 107a and 107b respectively. Fasteners (not shown) may be used to couple side portions 106b and 106c to rail system 108 through holes 107a and 107b. Strain relief 106 also includes vertical riser portions 106d, each of which defines a number of holes 107c. Cables routed from termination points 110 (not shown in FIG. 7) of chassis 102 may be positioned between, and coupled to, one or more of vertical riser portions 106d. For example, the cables may be tie-wrapped to one or more of vertical riser portions 106d by extending the tie-wraps through one or more of holes 107c. By securing the cables to strain relief 106, the force transferred to the cables and associated cable connectors at termination points 110 during extension and retraction of chassis 102 is minimized.

Figure 8:
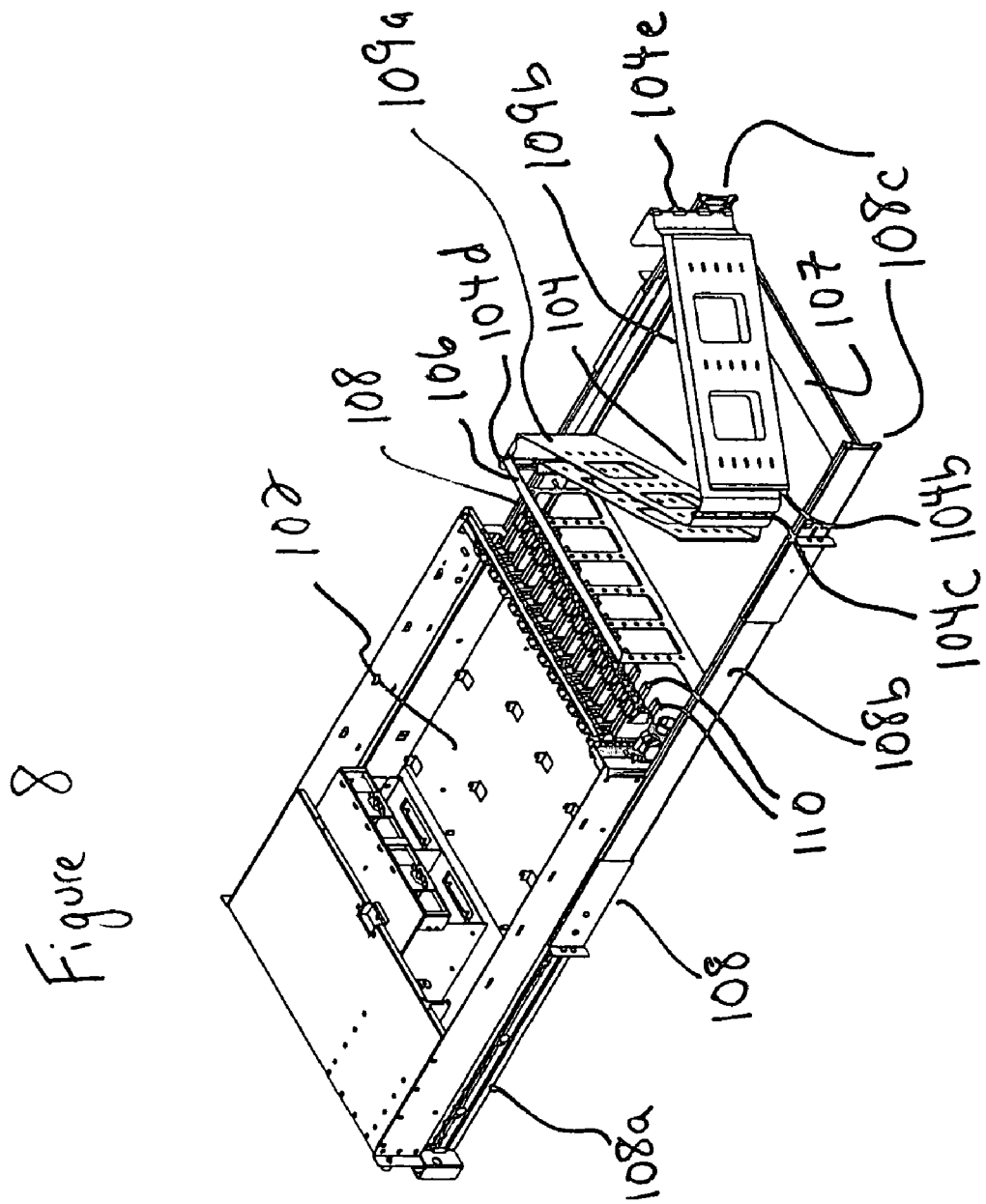
FIG. 8 is a rear perspective view of the chassis and cable routing system of FIG. 1 in a partially extended position.

FIG. 8 is a rear perspective view of chassis 102 in a partially extended position with respect to frame 100 (not illustrated in FIG. 8). As shown in FIG. 8, rail system 108 includes a chassis or inner portion 108a that is coupled to chassis 102. Inner portion 108a is slidingly engaged with frame or outer portion 108b of rail system 108. Although not shown in FIG. 8, cables coupled to termination points 110 extend through (and may be connected to) strain relief 106, and continue through channels 104a and 104b of folding arm assembly 104. As described above, at least partially because of the ratio of the channel height to the channel width (and the resulting increase in the relative length of the hinge 104c), folding arm assembly 104 maintains its vertical position in a substantially rigid form in the partially extended position illustrated in FIG. 8.

As illustrated in FIG. 8, hinged portion 104d of arm portion 109a (of folding arm assembly 104) is hingedly engaged with hinged portion 106a (shown clearly in FIG. 7) of strain relief 106. Further, hinged portion 104c hingedly couples arm portion 109b to arm portion 109a. Further still, hinged portion 104e of arm portion 109b (of folding arm assembly 104) is hingedly engaged with one of rail systems 108, as shown in FIG. 8. Through the use of the hinged portions 104c, 104d, and 104e, when chassis 102 extends and retracts with respect to the remainder of the computer system, folding arm assembly 104 extends and retracts between the retracted position illustrated in FIGS. 1–4A, the partially extended position illustrated in FIG. 8, and the fully extended position illustrated in FIG. 9.

In embodiments of the present invention utilizing two rail systems 108 to support the cable routing system (including strain relief 106 and folding arm assembly 104), two rail clip portions 108c may also be provided. Each of rail clip portions 108c may be coupled to horizontal strut 107, as shown in FIG. 8. Horizontal strut 107 provides support to folding arm assembly 104 when it is in the retracted or partially extended position. Further, horizontal strut 107 prevents or substantially limits rail twisting, for example, due to asymmetric loading.

Figure 9:
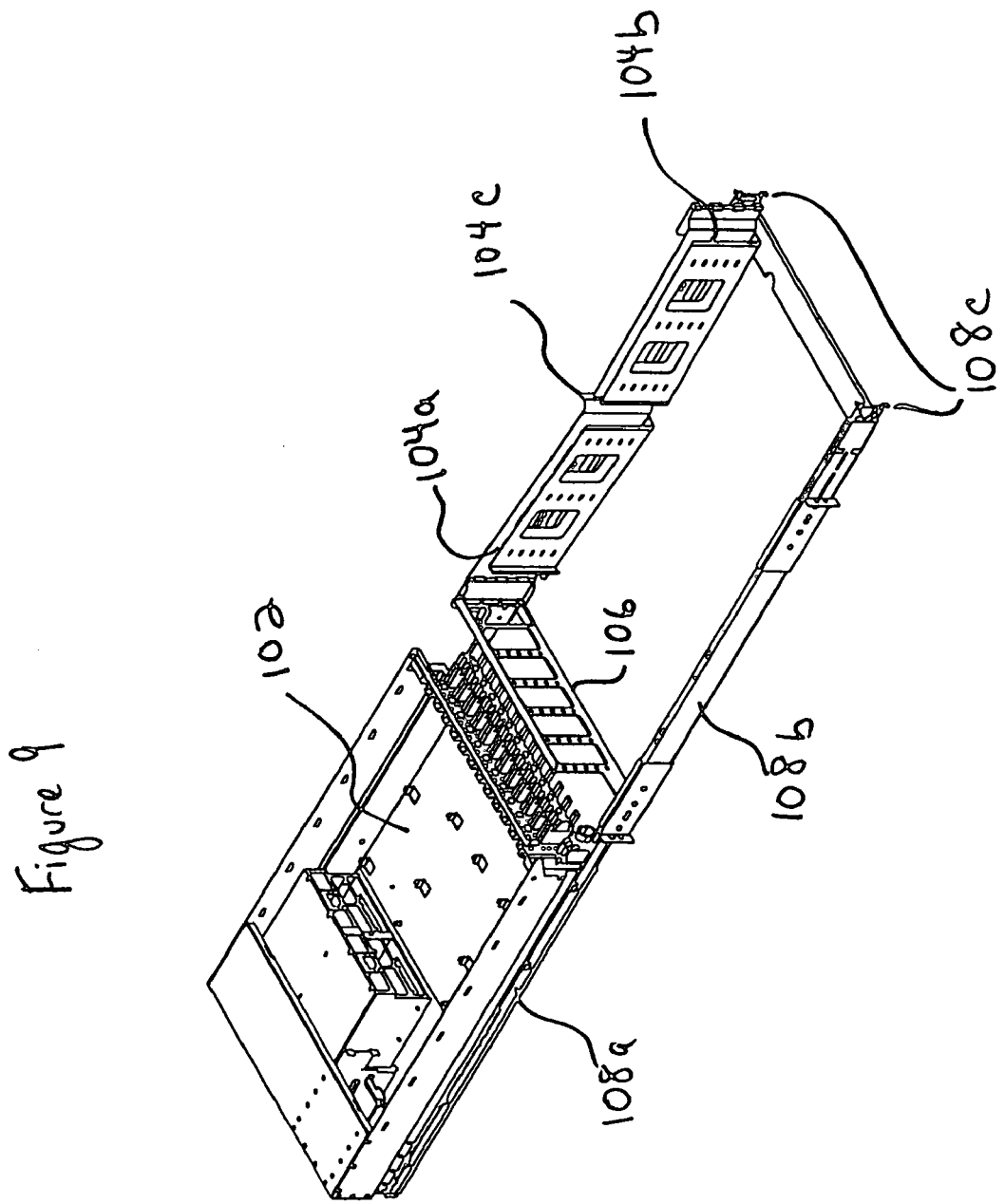
FIG. 9 is a rear perspective view of the chassis and cable routing system of FIG. 1 in an extended position.

FIG. 9 is a rear perspective view of chassis 102 in a fully extended position with respect to frame 100 (not illustrated in FIG. 9). In the embodiment of the present invention illustrated in FIG. 9, inner portion 108a of rail system 108 is substantially withdrawn from outer portion 108b. Additionally, because chassis 102 is extended with respect to the remainder of the computer system (including frame 100), folding arm assembly 104 is fully extended.

In the exemplary embodiment of the present invention illustrated in FIG. 9, strain relief 106 is coupled to inner portion(s) 108a of rail system(s) 108. As such, strain relief 106 moves along with chassis 102 when chassis 102 is extended and retracted with respect to the remainder of the computer system.

Figure 10:
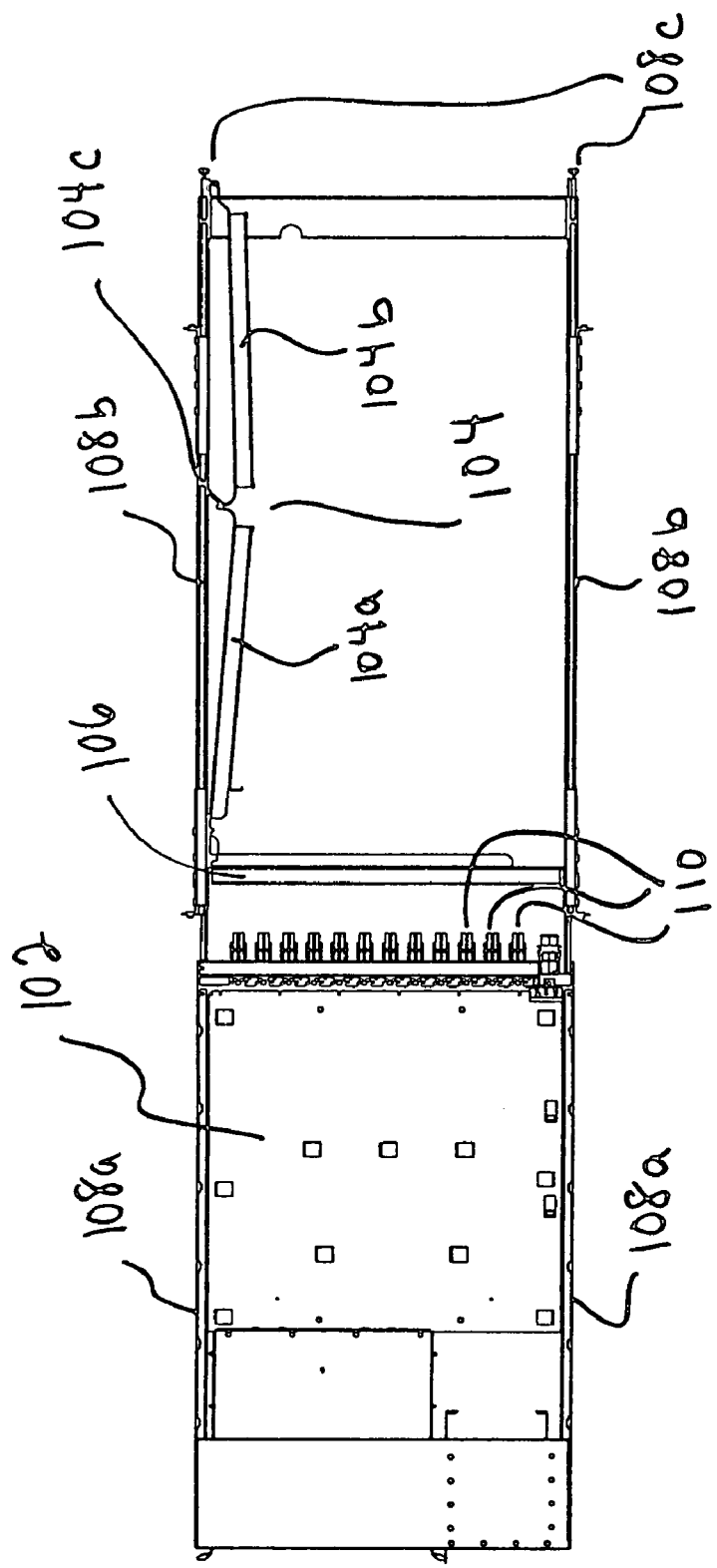
FIG. 10 is a top view of the chassis and cable routing system of FIG. 1 in an extended position.

FIG. 10 is a top view of chassis 102 in a fully extended position with respect to the remainder of the computer system (not shown in FIG. 10). In the exemplary embodiment of the present invention illustrated in FIG. 10, two rail systems 108 (each including a respective inner portion 108a and outer portion 108b) are provided to support chassis 102, strain relief 106, and folding arm assembly 104. As with the embodiment illustrated in FIG. 9, inner portion 108a is substantially withdrawn from outer portion 108b. Additionally, because chassis 102 is in the fully extended position, folding arm assembly 104 is also in a substantially extended position.

A connection configuration of the present invention as described above through various exemplary embodiments is as follows. Chassis 102 is coupled to chassis portion 108*a* of rail system 108. Frame 100 is coupled to folding arm assembly 104 through hinged portion 104*e*, rail portion 108*c*, and frame portion 108*b* of rail system 108. By extending and retracting chassis portion 108*a* with respect to frame portion 108*b*, chassis 102 is extended and retracted with respect to frame 100. Strain relief 106 is coupled to chassis portion 108*a*, and as such, strain relief 106 extends and retracts with respect to frame 100 along with chassis 102. Arm portion 109*a* of folding arm assembly 104 is coupled to strain relief 106 through hinged portion 104*d*. Arm portion 109*b* is coupled to arm portion 109*a* through hinged portion 104*c*. Arm portion 109*b* is coupled to frame portion 108*b* through hinged portion 104*e*. Through these hinged connections between strain relief 106 and frame 100, folding arm assembly 104 moves between a retracted position when chassis 102 is retracted with respect to frame 100, and an extended position when chassis 102 is extended with respect to frame 100.

Figure 11:
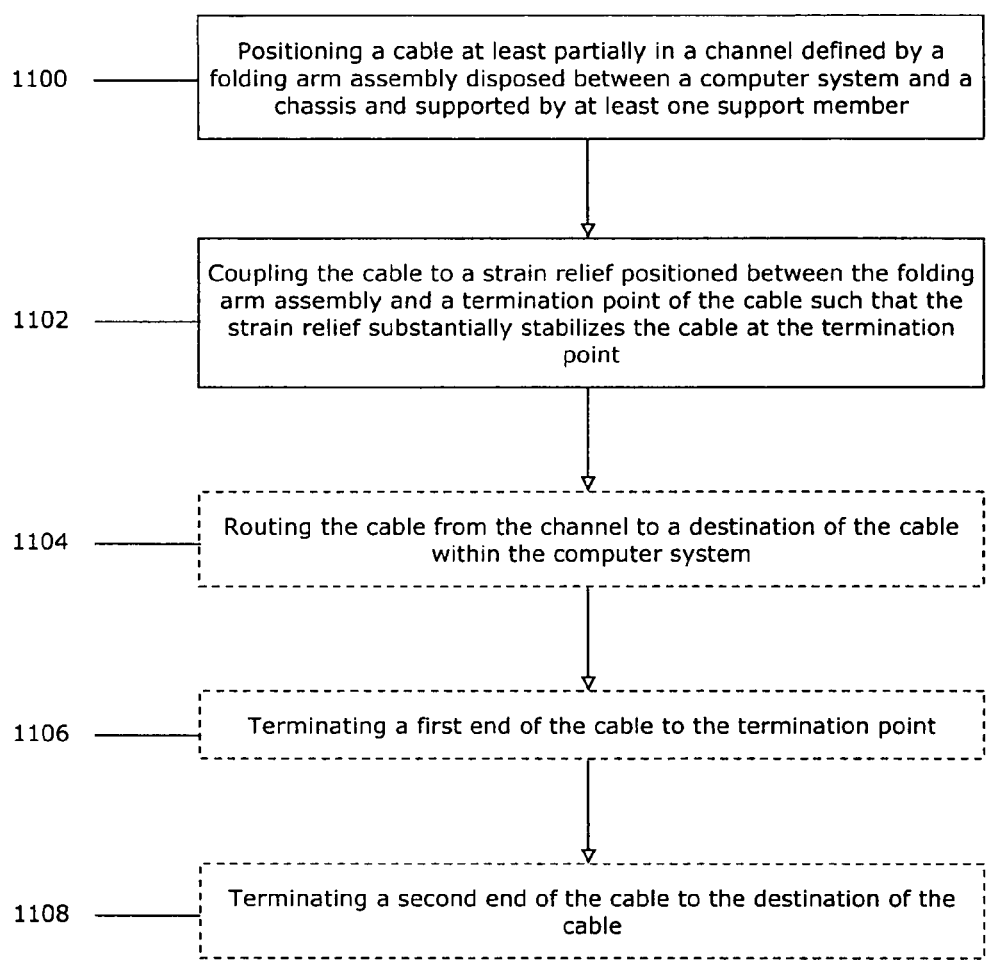
FIG. 11 is a flow diagram illustrating a method of routing a cable between a computer system and a chassis in accordance with an exemplary embodiment of the present invention.

FIG. 11 is a flow diagram illustrating a method of routing a cable 110*a* between a computer system and a chassis that may be extended and retracted with respect to the computer system along at least one support member. At step 1100, the cable is positioned at least partially in a channel defined by a folding arm assembly disposed between the computer system and the chassis and supported by the at least one support member. At step 1102, the cable is coupled to a strain relief positioned between the folding arm assembly and a termination point of the cable such that the strain relief substantially stabilizes the cable at the termination point. At optional step 1104, the cable is routed from the channel to a destination of the cable within the computer system. At optional step 1106, a first end of the cable is terminated to the termination point, where the termination point is between the chassis and the strain relief. At optional step 1108, a second end of the cable is terminated to the destination of the cable within the computer system. Although steps 1100–1108 are illustrated in a particular order in FIG. 11, the steps are not limited to the illustrated sequence. For example, optional step 1106 may be performed before any of steps 1100–1104, such that the first end of the cable is terminated to the termination point between the chassis and the strain relief before: (a) the cable is positioned at least partially within the channel, (b) the cable is coupled to the strain relief, and (c) the cable is routed to the destination.

As such, by providing strain relief 106 in connection with folding arm assembly 104, a system of relieving strain from the cables where the cables exit chassis 102 is provided. Potential damage to termination points 110 (e.g., including cable connector jackscrews) is reduced or substantially eliminated because of the substantial reduction of force (e.g., lateral force) to termination points 110. Further, because of the reduction or elimination of damage to termination points 110 or other components of chassis 102 due to the application of lateral force to the cables during the extension and retraction of chassis 102, the potential for EMI leakage with respect to chassis 102 is substantially reduced.

In certain exemplary embodiments of the present invention illustrated herein, strain relief 106 and folding arm assembly 104 are mounted to two rail systems 108. Although alternative embodiments are contemplated (e.g., a single rail system supporting strain relief 106 and folding arm assembly 104), the two rail system embodiment eliminates or substantially reduces rail twisting, for example, due to the weight of folding arm assembly 104 loaded with cables. This is because side to side support is provided at both strain relief 106 and folding arm assembly 104 by the two rail systems 108, and as such, both of rail systems 108 are substantially prevented from twisting. Such twisting could have otherwise caused damage and/or operational problems with folding arm assembly 104 and the cables routed therein had the two rail systems 108 not been utilized.

As described herein, desirable routing paths for cables between chassis 102 and other portions of the computer system is facilitated by certain exemplary embodiments of the present invention. For example, the cables extending from termination points 110 of chassis 102 are coupled to strain relief 106 (e.g., using tie wraps or the like), and as such, the cables are secured at strain relief 106 at a desirable location. Additionally, cables extend from strain relief 106 into channels (e.g., channels 104*a* and 104*b* defined by folding arm assembly 104), towards their destination within the remainder of the computer system or a location remote from the computer system. As such, a routing path for cables is provided such that the cables are not moved into an undesirable location during extension and retraction of chassis 102. This is particularly beneficial given that sufficient slack in the cables is provided to facilitate the extension and retraction of chassis 102. According to the present invention, this extra cable length is managed such that damage to the cables does not occur, and interference with extension and retraction of chassis 102 does not occur.

As provided above, the cable routing system described herein (e.g., including strain relief 106 and folding arm assembly 104) is mounted to rail systems 108. Rail systems 108 in turn mount to chassis 102 and frame 100. As such, because the cable routing system is mounted to rail systems 108, and not directly to frame 100, the cable routing system may be used in a variety of cabinet frame styles.

Through strain relief 106 and channels 104*a* and 104*b* of folding arm assembly 104, a routing path between chassis 102 and the remainder of the computer system is provided. Strain relief 106 and chassis 102 are both coupled to rails, and as such, when it is desired to extend or retract chassis 102 with respect to the remainder of the computer system, strain relief 106 moves laterally along with chassis 102 in a direction of extension or retraction. Folding arm assembly 104 allows for this extension and retraction while providing a protected routing path for the cables (i.e., in channels 104*a* and 104*b*).

Although the present invention has been described primarily by reference to folding arm assembly 104 including two arm portions 109*a* and 109*b* (including channels 104*a* and 104*b* respectively), it is not limited thereto. Any number of arm portions (and corresponding channels) may be provided to facilitate the extension and retraction of chassis 102 while protecting and guiding the cables. Further, arm assembly 104 may be a non-folding arm assembly, so long as the arm assembly facilitates the extension and retraction of chassis 102 while guiding the cables held in the channels of the arm assembly.

Likewise, the present invention has been illustrated and described primarily with the inclusion of a number of hinged portions in a number of specific locations; however, it is not limited thereto. The cable routing system may include hinged portions at a number of different locations, or may include no hinged portions at all, so long as the cables between chassis 102 and the remainder of the computer system are guided during extension and retraction of chassis 102.

Although the present invention has been described primarily by reference to a support member including two rail systems 108 for supporting strain relief 106 and folding arm assembly 104, while facilitating extension and retraction of chassis 102, it is not limited thereto. Any number of rail systems may be included so long as the desired functions are provided. For example, a single rail system could be provided for facilitating the extension and retraction of chassis 102. Further, support member 108 may be selected from other types of support structures other than rail systems.

Although the present invention has been described primarily by reference to using tie wraps to connect the cables to strain relief 106, it is not limited thereto. Any of a number of connecting devices may be used, for example, tape, Velcro strips, etc.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A cable routing system facilitating interconnection between a computer system and a chassis that may be extended and retracted with respect to the computer system along at least one support member, said cable routing system comprising:
    a folding arm assembly supported by the at least one support member such that said folding arm assembly is moveable between a retracted position when the chassis is retracted with respect to the computer system and an extended position when the chassis is extended with respect to the computer system, said folding arm assembly defining at least one channel for routing a cable between the chassis and the computer system;
    a strain relief supported by the at least one support member and positioned between said folding arm assembly and a termination point of the cable such that said strain relief substantially stabilizes the cable at the termination point, wherein the at least one support member includes two rail systems; and
    a rail clip coupled to each of said two rail systems and configured for compression and expansion in at least one dimension thereof through actuation of a spring loaded mechanism included in said rail clip such that each of said rail clips is coupled to a respective one of said rail systems by engaging each of said spring loaded mechanisms with a respective aperture of each of said rail systems.

2. The cable routing system of claim 1 wherein the support member includes an chassis support member slidingly engaged with a frame support member.

3. The cable routing system of claim 2 wherein the chassis and said strain relief are coupled to the chassis support member of the support member, and said folding arm assembly is coupled to the frame support member.

4. The cable routing system of claim 1 wherein said folding arm assembly includes at least two arm portions, each of said arm portions defining a portion of said channel.

5. The cable routing system of claim 4 wherein said at least two arm portions are hingedly coupled to one another, thereby facilitating guided movement of cables held within said portions of said channel as the chassis is extended and retracted with respect to the computer system.

6. The cable routing system of claim 4 wherein at least one of said arm portions is hingedly coupled to said strain relief, and another of said arm portions is hingedly coupled to the support member, said one and said another of said arm portions being hingedly coupled to one another, such that as the chassis extends and retracts with respect to the computer system said strain relief moves along the support member with the chassis, and said arm portion hingedly coupled to said strain relief facilitates movement of said folding arm assembly between the extended and retracted position as the chassis extends and retracts with respect to the computer system.

7. The cable routing system of claim 1, said cable routing system additionally comprising a strut extending between said two rail clips, said strut at least partially supporting said folding arm assembly.

8. A computer system comprising:
    a frame;
    a chassis that may be extended and retracted with respect to said frame;
    a support member along which said chassis is extended and retracted with respect to said frame;
    a folding arm assembly at least partially supported by said support member such that said folding arm assembly is moveable between a retracted position when said chassis is retracted with respect to the frame and an extended position when said chassis is extended with respect to the frame, said folding arm assembly defining at least one channel for routing a cable between the chassis and said frame;
    a strain relief at least partially supported by said support member and positioned between said folding arm assembly and a termination point of the cable such that said strain relief substantially stabilizes the cable at the termination point; and
    a rail clip coupled to said support member and configured for compression and expansion in at least one dimension thereof through actuation of a spring loaded mechanism included in said rail clip such that said rail clip is coupled to said support member.

9. The computer system of claim 8 wherein said support member includes a chassis support member slidingly engaged with a frame support member.

10. The computer system of claim 9 wherein said chassis and said strain relief are coupled to said chassis support member, and said folding arm assembly is coupled to said frame support member.

11. The computer system of claim 8 wherein said folding arm assembly includes at least two arm portions, each of said arm portions defining a portion of said channel.

12. The computer system of claim 11 wherein said at least two arm portions are hingedly coupled to one another, thereby facilitating guided movement of cables held within said portions of said channel as the chassis is extended and retracted with respect to the computer system.

13. The computer system of claim 11 wherein at least one of said arm portions is hingedly coupled to said strain relief, and another of said arm portions is hingedly coupled to said support member, said one and said another of said arm portions being hingedly coupled to one another, such that as the chassis extends and retracts with respect to the frame said strain relief moves along said support member with said chassis, and said arm portion being hingedly coupled to said strain relief facilitates movement of said folding arm assembly between the extended and retracted position as said chassis extends and retracts with respect to the computer system.

14. The computer system of claim 8 additionally comprising a a strut coupled to said support member, said strut at least partially supporting said folding arm assembly.

15. A support assembly for supporting a chassis that may be extended and retracted with respect to a frame, said support assembly comprising:
- a rail system including a chassis portion and a frame portion, the chassis portion being coupled to the chassis and slidingly moveable with respect to said frame portion between a retracted position when the chassis is retracted with respect to the frame and an extended position when said chassis is extended with respect to the frame, said frame portion being configured to be coupled to the frame;
- a plurality of arm portions hingedly connected to one another and extending between said chassis portion of said rail system and said frame portion of said rail system such that said arm portions are retracted with respect to one another when the chassis is retracted with respect to the frame, and said arm portions are extended with respect to one another when the chassis is extended with respect to the frame, each of said arm portions defining a channel configured to receive a cable;
- a strain relief positioned between said arm portions and the chassis, said strain relief substantially stabilizing a cable at the strain relief, the cable extending from the chassis to said channels defined by said arm portions; and
- a rail clip coupled to said rail system and configured for compression and expansion in at least one dimension thereof through actuation of a spring loaded mechanism included in said rail clip such that said rail clip is coupled to said rail system.

16. The support assembly of claim 15 wherein said strain relief is coupled to said chassis portion such that said strain relief moves with the chassis during extension and retraction of the chassis with respect to the frame.

17. The support assembly of claim 15 wherein said rail system includes two of said chassis portion and two of said frame portion, each of said chassis portions being coupled to the chassis and slidingly engaged with a respective one of said frame portions, each of said frame portions being configured to be coupled to the frame such that said chassis portions are moveable with respect to said frame portions between said retracted position when the chassis is retracted with respect to the frame and said extended position when said chassis is extended with respect to the frame.

18. The support assembly of claim 15 wherein said chassis portion is an inner portion of said rail system, and said frame portion is an outer portion of said rail system, said inner portion being slidingly moveable with respect to said outer portion.

* * * * *